United States Patent

Miller

[15] 3,686,513

[45] Aug. 22, 1972

[54] VOLTAGE RATIO CIRCUIT

[72] Inventor: Robert L. Miller, Horsham, Pa.

[73] Assignee: Honeywell, Inc., Minneapolis, Minn.

[22] Filed: Aug. 9, 1971

[21] Appl. No.: 170,031

[52] U.S. Cl. ....................307/229, 328/161

[51] Int. Cl. ....................G06g 7/12

[58] Field of Search .......307/229; 328/161; 235/184, 235/196

[56] References Cited

UNITED STATES PATENTS 3,476,924 11/1969 Conger ....................235/184 X

*Primary Examiner*—Donald D. Forrer
*Assistant Examiner*—B. P. Davis
*Attorney*—Arthur H. Swanson et al.

[57] ABSTRACT

A ratio computing circuit for determining the ratio of two input signals by using a first input signal to preset the resistance of a field-effect transistor. The transistor resistance is connected to a summing junction algebraically summing a reference signal with a signal developed by the first input signal through the transistor resistance.

An input of an amplifier is connected to the summing junction while the amplifier output is used to control the transistor resistance to reduce the net signal to a zero level. A capacitor is used to store the output signal from the amplifier. A plurality of concurrently operated switching means are arranged to replace the first input signal with a second input signal while connecting an output of the amplifier to the summing junction to replace the reference signal and to an output terminal. The capacitor is used to retain the transistor resistance at its former value whereby the signal on the output terminal is the ratio of the two input signals.

3 Claims, 1 Drawing Figure

Patented Aug. 22, 1972 3,686,513
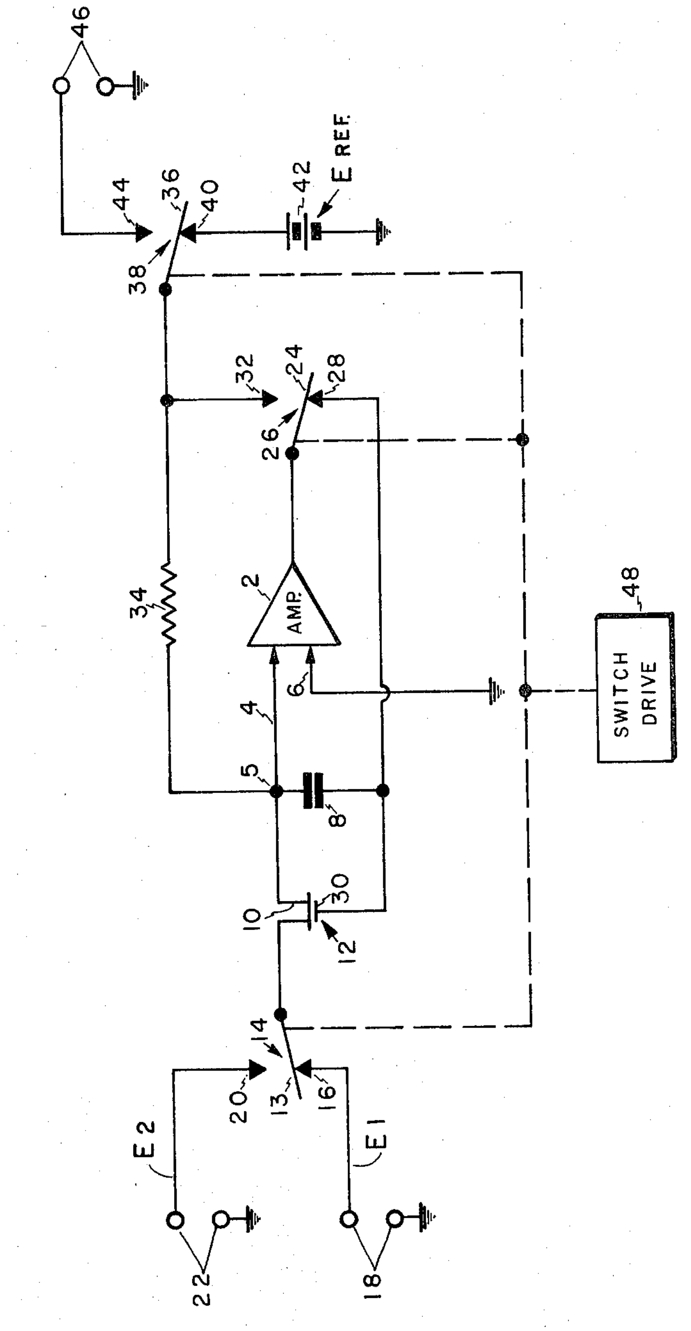
INVENTOR.
ROBERT L. MILLER
BY
M. J. Halista

VOLTAGE RATIO CIRCUIT

The present invention relates to analog computing circuits. More specifically, the present invention relates to a circuit for computing the ratio of two input analog signals applied thereto.

An object of the present invention is to provide an improved voltage ratio computing circuit.

Another object of the present invention is to provide an improved voltage ratio computing circuit for producing an output signal indicative of the ratio of a pair of input signals thereto.

A further object of the present invention is to provide an improved ratio computing circuit for producing an output signal representative of a ratio of a pair of input signals applied thereto and an inherent independence of a malfunctioning of a major number of the circuit elements in the ratio circuit.

SUMMARY OF THE INVENTION

In accomplishing these and other objects, there has been provided, in accordance with the present invention, a voltage ratio computing circuit including an operational amplifier having a pair of selectable feedback circuits. A first feedback circuit includes a resistor while a second feedback circuit includes a capacitor. The first and second feedback circuits are selected by the operation of a switching means connected to the output of the operational amplifier. The pair of input signals to be ratioed are connected alternately to the input terminal of the operational amplifier through the drain and source electrodes of a field effect transistor. The gate electrode of the field effect transistor is connected to the output of the first switching means for the second feedback loop. The output of the first feedback loop from the first switching means is also connected to a third switching means alternately actuated between a source of voltage reference and an output terminal. The first, second and third switching means are synchronously operated by a common switch actuating means.

BRIEF DESCRIPTION OF THE DRAWING

The single FIGURE drawing is a schematic illustration of a ratio computing circuit embodying the present invention.

DETAILED DESCRIPTION

Referring to the single FIGURE drawing, there is shown an operational amplifier 2 having an input line 4 and connected to a first input terminal thereof. A second input terminal of the operational amplifier 2 is connected to a second input line 6 which is arranged to be connected to a common return or ground. The first input line 4 is connected to one side of a feedback capacitor 8 and to a source electrode 10 of a field effect transistor 12 hereinafter referred to as FET 12. The drain electrode of the field effect transistor 12 is connected to the moveable armature 13 of a selectively actuable switching device 14. A first contact 16 of the switching device 14 is connected to one of a first pair of input terminals 18 while the other one of input terminals 18 is connected to the common return. The other contact 20 of the switching device 14 is connected to one of the second pair of input terminals 22. The other one of the second pair of input terminals 22 is connected to the common return. The output signal from the amplifier 2 is connected to the moveable armature 24 of a second selectively actuable switching device 26. A first contact 28 of the switching device 26 is connected to the other side of the feedback capacitor 8 and to the gate electrode 30 of the FET 12. The other contact 32 of the switching device 26 is connected to one end of a feedback resistor 34. The other end of the feedback resistor 34 is connected to the first input line 4. The second contact 32 is also connected to a moveable armature 36 of a third selectively actuable switching device 38. A first contact 40 of the third switching device 38 is connected to one side of a reference signal source 42. The other side of the reference signal source 42 is connected to the ground return path. A second contact 44 of the third switching device 38 is connected to one terminal of a pair of output terminals 46. The other one of the output terminals 46 is connected to the ground return path. A switch drive means 48 is arranged to concurrently operate the moveable armatures 13, 24, & 36 of the first, second, and third switching devices 14, 26, & 38 respectively. It should be noted that while the switching devices 14, 26, & 38 have been shown for purposes of clarity as electromechanically operative switches, they could be any suitable switching devices such as transistor circuits which would be operated in synchronism to perform the desired switching functions.

In operation, the ratio computing circuit of a present invention is effective to provide an output signal at the output terminals 46 which is a ratio of the input signals applied to the input terminals 18 and 22. Specifically, this output signal is defined by the following equation:

$$E_{OUT}=E_2(E_{REF})/E_1 \qquad (1.)$$

as described hereinafter. Thus, the ratio of the two input signals is not affected by the operational stability of either the operational amplifier 2, the field-effect transistor 12 or the feedback resistor 34.

The battery 42 is used as a reference source, $E_{REF}$, having an output level which appears in the aforesaid output signal. Accordingly, the source 42 is arranged to provide a stable reference signal to assure the stability of the output signal on the terminals 46.

The switching devices 14, 26 and 38, of course, do not affect the output signal level by their switching speed and are only required to actually switch from one switch position to the other when actuated by the relay drive means 48. Accordingly, they can be considered not to be active circuit elements with respect to the amplitude of the output signal appearing on the output terminals. Hence the accuracy of this output signal is independent of the stability of a major number of the active circuit elements of the ratio computing circuit of the present invention.

With the switching devices 14, 26 and 38 initially in the position shown in the single FIGURE drawing, the input signal $E_1$ on input terminals 18 is applied to the drain terminal of the FET 12.

The resistance of the FET 12 between the drain and source terminals thereof, accordingly, determines the current flow into the summing junction 5. This resistance of the FET 12 is controlled by an output signal from amplifier 2 applied through the switch means 26 to the gate electrode 30 of the FET 12. This output signal from the amplifier 2 is representative of the input signal applied to the amplifier 2 from the summing junction 5. The summing junction 5 is arranged to sum the signals applied thereto including the aforesaid current from the source of the first input signal $E_1$. A second input signal, $E_{REF}$, to the summing junction 5 is obtained from a current flow through the feedback resistor 34 from the reference battery 42. This current is determined by the value of the resistance 34 and and the fixed voltage of the reference source 42. This second input to the summing junction 5 is arranged to be of opposite polarity to the first input signal $E_1$ to algebraically sum with the first input signal $E_1$ to produce a net difference signal on the input line 4 to the amplifier 2. Using conventional operational amplifier theory, the amplifier 2 acts to reduce this difference signal to a zero level by altering the amplifier output signal applied to the gate electrode 30 of the FET 12. Finally, the balanced condition is defined by:

$$E_1/R_{FET}=E_{42}/R_{34} \qquad (2.)$$

The output signal from the amplifier 2 necessary to achieve this state is also stored in the capacitor 8.

The switches 14, 26, and 38 are, then, concurrently operated by the switch drive 48 to the opposite state from that illustrated in the single figure drawing, i.e., a second switch position. In this state of the switches 14, 26 and 38, the second input signal $E_2$ on the input terminals 22 is applied to the drain terminal of the FET 12. The voltage stored in the capacitor 8 is now effective to maintain the resistance of the FET 12 at its former value since the amplifier 2 was disconnected from the gate electrode 30 by the operation of the second switch 26. Further, in the second position of the switch 26 the amplifier 2 is now connected across the feedback resistor 34, and in the second position of the switch 38 the output of the amplifier 2 is applied to the output terminals 46. Since the resistance of the FET 12 and the resistor 34 are now in series and the amplifier 2 is connected across the resistor 34, the circuit becomes a simple operational amplifier circuit wherein:

$$E_{46}/E_2=R_{46}/R_{FET} \qquad (3.)$$

Substituting the value of $R_{FET}$ from equation (2), since $R_{FET}$ has been maintained constant by the capacitor 8, and solving for $E_{46}$ we derive the previously described equation (1).

Accordingly, it may be seen that there has been provided, in accordance with the present invention, an improved ratio computing circuit for determining the ratio of a pair of input signals applied thereto and being operatively independent of a malfunctioning of a major number of circuit elements in the computing circuit.

What is claimed is:

1. A ratio computing circuit comprising a first input terminal;

a second input terminal;

a variable impedance means;

a first switching means having a first switch state for selectively connecting said first input terminal to a first side of said variable impedance means and a second switch state for connecting said second input terminal to said first side;

a summing junction connected to a second side of said impedance means;

amplifier means having an input connected to said summing junction to amplify an output signal from said summing junction;

constant impedance means having an output connected to said summing junction;

capacitor means connected to said summing junction;

second switching means having a first switch state to selectively connect an output signal from said amplifier means to said variable impedance means to control the impedance thereof and a second switch state to connect an input of said constant impedance means to said amplifier output signal;

reference signal means;

output terminal means;

third switch means having a first switch position for connecting said input of said constant impedance means to said reference signal means and a second switch position for connecting said input of said constant impedance to said output terminal means; and actuating means for synchronously operating said first, second and third switch means between their first and second switch states.

2. A ratio computing circuit as set forth in claim 1 wherein said variable impedance means is a field-effect transistor and said first state of said second switch means is arranged to apply an output signal from said amplifier means to a gate electrode of said transistor.

3. A ratio circuit as set forth in claim 2 wherein said constant impedance means is a resistor.

* * * * *